(12) United States Patent
Hirasawa et al.

(10) Patent No.: US 6,555,763 B1
(45) Date of Patent: *Apr. 29, 2003

(54) MULTILAYERED CIRCUIT BOARD FOR SEMICONDUCTOR CHIP MODULE, AND METHOD OF MANUFACTURING THE SAME

(75) Inventors: Koki Hirasawa, Tokyo (JP); Teruo Ono, Kagoshima (JP)

(73) Assignees: Fuchigami Micro Co., Ltd., Kagoshima (JP); NEC Compound Semiconductor Devices Ltd., Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/397,016

(22) Filed: Sep. 15, 1999

(30) Foreign Application Priority Data

Sep. 18, 1998 (JP) .............................. 10-264410

(51) Int. Cl.[7] .......................... H01R 12/04; H05K 1/11
(52) U.S. Cl. ....................................... 174/264; 174/262
(58) Field of Search ................................ 174/262, 263, 174/264, 265, 266, 252; 361/792, 793, 794, 795

(56) References Cited

U.S. PATENT DOCUMENTS

| 5,396,397 A | * | 3/1995 | McClanahan et al. ...... 361/794 |
| 5,517,751 A | * | 5/1996 | Bross et al. ................. 29/830 |
| 6,156,980 A | * | 12/2000 | Peugh et al. ................ 174/252 |

FOREIGN PATENT DOCUMENTS

| JP | 6-318668 | 11/1994 |
| JP | 6-318669 | 11/1994 |
| JP | 7-86736 | 3/1995 |
| JP | 8-306820 | 11/1996 |

OTHER PUBLICATIONS

Japanese Office Action, dated Jun. 27, 2000, with partial English translation.

* cited by examiner

Primary Examiner—David L. Talbott
Assistant Examiner—Jeremy Norris
(74) Attorney, Agent, or Firm—McGinn & Gibb, PLLC

(57) ABSTRACT

A multilayered circuit board for a semiconductor chip module includes an underlying board, insulating layers, fixed-potential wiring layers, via holes, and metal layers. The underlying board has a major surface made of a metal material to which a fixed potential is applied. The insulating layers are stacked on the major surface of the underlying board and have wiring layers formed on their surfaces. The fixed-potential wiring layers constitute part of the wiring layers formed on the insulating layers. The via holes are formed below the fixed-potential wiring layers to extend through the insulating layers. The metal layers are filled in the via holes so as to make upper ends be connected to the lower surfaces of the fixed-potential wiring layers. One of the insulating layers in contact with the major surface of the underlying board is formed on the underlying board while the lower end of the metal layer is in contact with the major surface of the underlying board. The other insulating layer formed on the insulating layer in contact with the major surface of the underlying board is stacked while the lower end of the metal layer is in contact with the upper surface of the fixed-potential wiring layer of one insulating layer.

15 Claims, 5 Drawing Sheets

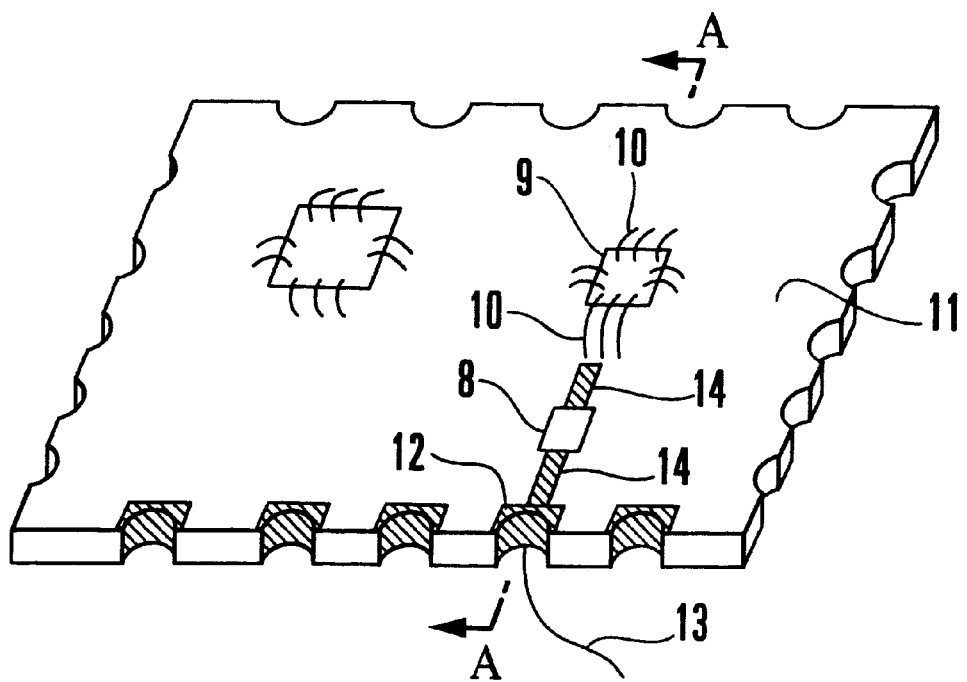
PRIOR ART  FIG. 7A
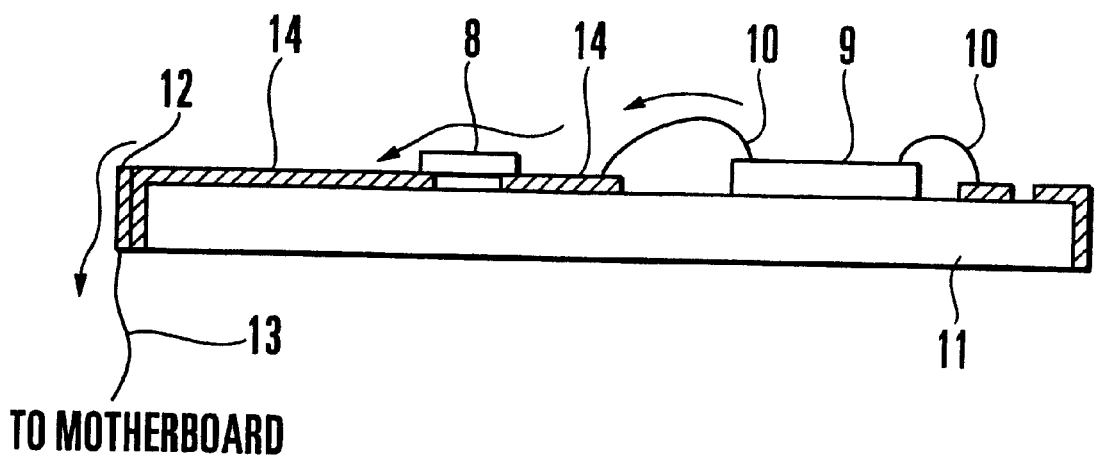
TO MOTHERBOARD
PRIOR ART  FIG. 7B

US 6,555,763 B1

MULTILAYERED CIRCUIT BOARD FOR SEMICONDUCTOR CHIP MODULE, AND METHOD OF MANUFACTURING THE SAME

BACKGROUND OF THE INVENTION

The present invention relates to a multilayered circuit board for a semiconductor chip module and, more particularly, to a multilayered circuit board for a semiconductor chip module suitable for high-density wiring.

Recently in a multilayered circuit board for a semiconductor chip module, the semiconductor chip module having a plurality of IC chips is mounted on the die pad of a lead frame. The electrodes between the IC chips mounted on the lead frame and the multilayered circuit board, the lead frame, and the semiconductor chip module board are electrically connected by bumps or wire bonding.

The mainstream of such multilayered circuit boards is a resin-layered board prepared by forming a thin-film multilayered circuit of copper and polyimide on an underlying board of ceramics or the like.

FIGS. 7A and 7B show an example of a conventional multilayered circuit board for a semiconductor chip module. FIG. 7A shows the whole structure, and FIG. 7B shows a section taken along the line A—A in FIG. 7A.

As shown in FIG. 7A, a semiconductor chip 9 and chip component 8 are mounted on a conventional multilayered circuit board 11 for a semiconductor chip module. The semiconductor chip 9 and chip component 8 are connected by bonding wires 10, GND wiring layers 14 on the board surface, and metallized portions 12 at the board edge to the GND terminal (not shown) of a motherboard on which the multilayered circuit board 11 is mounted.

In the conventional board structure, a current to the GND terminal flows from the semiconductor chip 9 to the GND terminal of the motherboard through the bonding wire 10, chip component 8, GND wiring layer 14, metallized portion 12, and lead wire 13, as indicated by the arrows in FIG. 7B. The metallized portion 12 which passes a current to the GND terminal is formed at the peripheral portion of the multilayered circuit board 11. The GND wiring layer 14 must be extended to the metallized portion 12 at the peripheral portion, which prolongs the GND wiring layer 14.

In the conventional multilayered circuit board for a semiconductor chip module, the long GND wiring layer increases the resistance and impedance of the GND wiring layer, and a potential higher than the correct GND potential is undesirably supplied to the semiconductor chip. The long GND wiring layer also increases power consumption.

SUMMARY OF THE INVENTION

It is, therefore, a principal object of the present invention to shorten the GND wiring layer of a multilayered circuit board for a semiconductor chip module suitably for high-density wiring.

To achieve the above object, according to the present invention, there is provided a multilayered circuit board for a semiconductor chip module, comprising an underlying board having a major surface made of a metal material to which a fixed potential is applied, insulating layers which are stacked on the major surface of the underlying board and have wiring layers formed on surfaces of the insulating layers, fixed-potential wiring layers constituting part of the wiring layers formed on the insulating layers, via holes formed below the fixed-potential wiring layers to extend through the insulating layers, and metal layers filled in the via holes so as to make upper ends be connected to lower surfaces of the fixed-potential wiring layers, wherein one of the insulating layers in contact with the major surface of the underlying board is formed on the underlying board while a lower end of the metal layer is in contact with the major surface of the underlying board, and the other insulating layer formed on the insulating layer in contact with the major surface of the underlying board is stacked while a lower end of the metal layer is in contact with an upper surface of the fixed-potential wiring layer of the one insulating layer.

BRIEF DESCRIPTION OF THE DRAWINGS

FIGS. 3A to 3E are sectional views, respectively, showing the steps in manufacturing the multilayered circuit board for a semiconductor chip module according to the present invention, in which FIG. 3A shows the step of preparing a material, FIG. 3B shows the step of forming a via hole in each layer, FIG. 3C shows the step of filling the via hole with a metal, FIG. 3D shows the step of forming a wiring pattern, and FIG. 3E shows the stacking/compression bonding step;

FIGS. 4A and 4B are sectional views, respectively, showing an example of a connection method in the method of manufacturing the multilayered circuit board for a semiconductor chip module according to the present invention, in which FIG. 4A shows the connection method before compression bonding, and FIG. 4B shows the connection method after compression bonding;

FIGS. 5A and 5B are sectional views, respectively, showing another example of the connection method in the method of manufacturing the multilayered circuit board for a semiconductor chip module according to the present invention, in which FIG. 5A shows the connection method before compression bonding, and FIG. 5B shows the connection method after compression bonding;

FIGS. 7A and 7B are views showing a prior art structure, in which FIG. 7A is a perspective view showing the whole structure of the prior art, and FIG. 7B is a sectional view taken along the line 7B—7B in FIG. 7A showing the flow of a current to the GND terminal.

DESCRIPTION OF THE PREFERRED EMBODIMENTS

Preferred embodiments of the present invention will be described in detail below with reference to the accompanying drawings.

Figure 1:
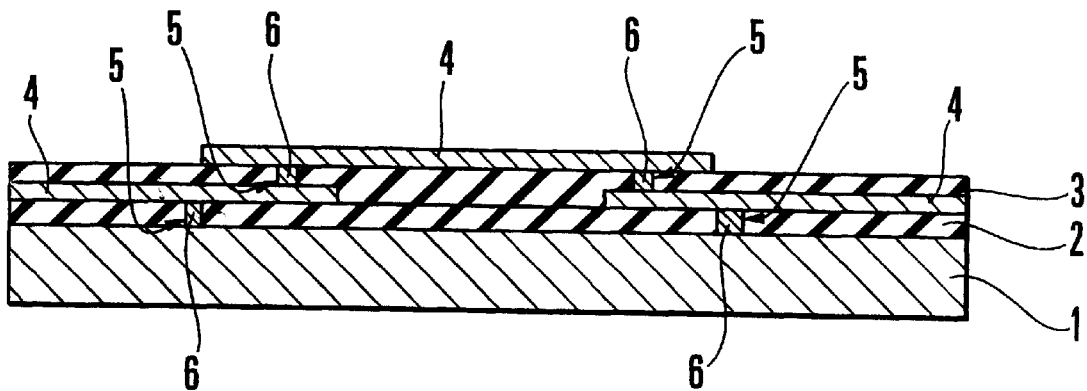
FIG. 1 is a sectional view showing the structure of a multilayered circuit board for a semiconductor chip module according to an embodiment of the present invention.

FIG. 1 shows the structure of a multilayered circuit board for a semiconductor chip module according to an embodiment of the present invention. This multilayered circuit board comprises a copper metal plate 1 serving as an underlying board, organic resin sheets 2 and 3 serving as two insulating layers, and copper wiring layers formed on the organic resin sheets 2 and 3. The wiring layers formed on the organic resin sheets 2 and 3 include GND wiring layers 4. In this embodiment, for descriptive convenience, the organic resin sheets are formed from two layers. However, even if the organic resin sheets are formed from three or more layers, the same basic structure can be applied. For illustrative convenience, only the GND wiring layer 4 is illustrated as the wiring layer formed on each organic resin sheet.

The organic resin sheets 2 and 3 are made of an organic resin such as polyimide. The organic resin sheets 2 and 3 have via holes 5 for electrically connecting the GND wiring layers 4 to each other, and the GND wiring layers 4 and metal plate 1. The via holes 5 formed in the organic resin sheets 2 and 3 are filled with metal layers 6 for electrically connecting the respective layers. An example of the metal layers 6 filled in the via holes 5 is plated copper prepared by electroplating using copper foil as a plating electrode. The metal plate 1 having the organic resin sheet 2 is connected to the GND terminal of a motherboard (not shown), and to the GND wiring layers 4 on the respective wiring layers through the metal layers 6 in the via holes 5.

A plurality of chips are mounted on the upper surface of the multilayered circuit board having this structure to constitute a semiconductor chip module (multi-chip module: MCM). The semiconductor chip module constituting the MCM having a plurality of chips is mounted on, e.g., a motherboard.

In this embodiment, the metal plate 1 may be formed from a lead frame.

Figure 2:
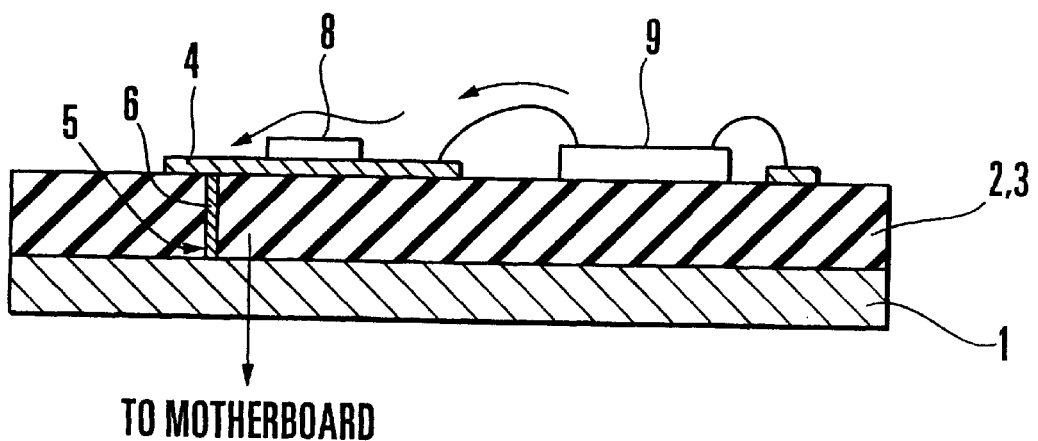
FIG. 2 is a sectional view showing the flow of a current to the GND terminal in the multilayered circuit board for a semiconductor chip module according to the embodiment of the present invention.

FIG. 2 shows the semiconductor chip module using the multilayered circuit board shown in FIG. 1. A chip component 8 and semiconductor chip 9 are mounted on the upper surface of the multilayered circuit board. Note that the multilayered circuit board shown in FIG. 2 is not in one-to-one correspondence with the structure in FIG. 1. FIG. 2 shows only one of the via holes 5 formed in the organic resin sheets 2 and 3.

The flow of a current to the GND terminal will be explained with reference to FIG. 2. As indicated by the arrows in FIG. 2, a current to the GND terminal (not shown) of the motherboard shown in FIG. 1 flows from the semiconductor chip 9 and chip component 8 to the GND wiring layer 4, then directly flows into the metal plate 1 through the metal layers 6 in the via holes 5 formed in the organic resin sheets 2 and 3, and flows from the metal plate 1 to the GND terminal of the motherboard. This current flow is compared with the current flow in the prior art shown in FIG. 7B. In the prior art, the GND wiring layer 14 is extended to the metallized portion formed at the end portion of the multilayered circuit board. To the contrary, in the present invention, the GND wiring layer 4 is directly connected to the metal plate 1 through the via hole 5, and thus can be greatly shortened.

Figure 3A:
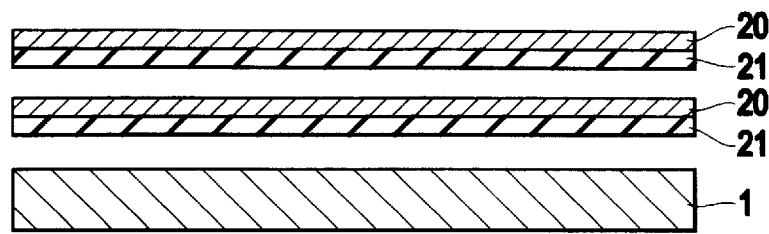
Figure 3B:
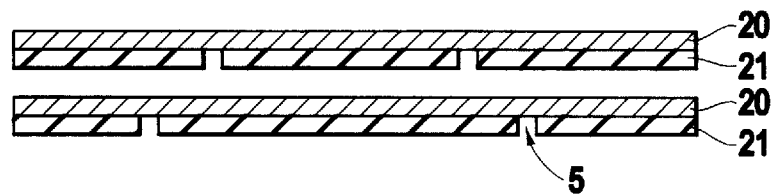
Figure 3C:
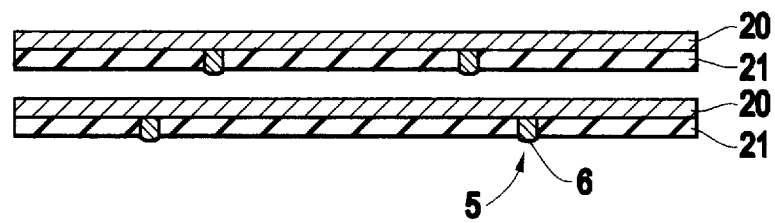
Figure 3D:
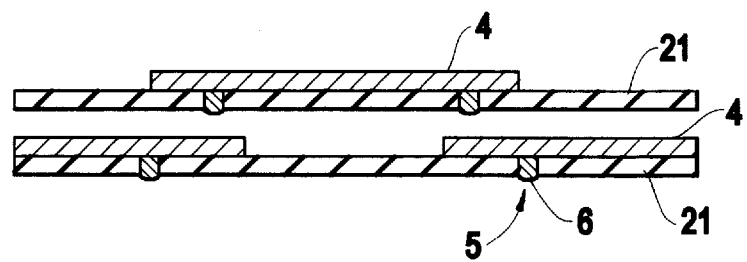
Figure 3E:
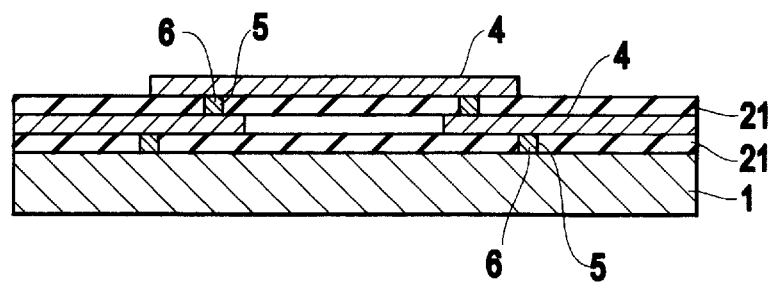

FIGS. 3A to 3E show the steps in manufacturing the multilayered circuit board for a semiconductor chip module according to the present invention. FIGS. 3A to 3E show an example of manufacturing the multilayered circuit board shown in FIG. 1. FIG. 3A shows the step of preparing a material, FIG. 3B shows the step of forming a via hole in each layer, FIG. 3C shows the step of filling the via hole with copper, FIG. 3D shows the step of forming a wiring layer including a GND wiring layer, and FIG. 3E shows the stacking/compression bonding step.

In the manufacturing method of the present invention, before stacking respective layers, via holes and a wiring pattern are formed, and after forming the wiring pattern, layers are stacked and compression-bonded.

As shown in FIG. 3A, a copper metal plate 1 serving as an underlying board, and sheets each formed by adhering a polyimide (PI) film 21 about 50 μm thick to copper foil 20 about 10 to 18 μm thick are prepared. The PI film 21 has a multilayered structure in which a PI film having a low thermal expansion coefficient is sandwich between adhesive PI films so as to attain a proper contact strength against a metal and a thermal expansion coefficient coping with that of the metal.

As shown in FIG. 3B, via holes 5 are formed in the PI film 21. At this time, each via hole 5 is formed at a predetermined position in the PI film 21 using a YAG laser or the like. In forming the via hole 5, the laser beam diameter is decreased to about 10 to 40 μm, thereby appropriately forming the via hole 5 about 50 to 100 μm in diameter. When the via hole is formed by plasma etching without using any laser, the plasma etching adopts a mask of, e.g., a metal film about 2 to 5 μm thick formed by plating and patterning Cu or Ni.

As shown in FIG. 3C, the via hole 5 is filled with a metal layer 6. The metal layer 6 filled in the via hole 5 is made of plated copper prepared by electroplating using copper foil as a plating electrode. When the metal layer 6 is to be filled in the via hole 5 by electroplating, the lower end of the metal layer 6 is adjusted to project about 1 to 3 μm.

As shown in FIG. 3D, the copper foil 20 is etched to form a wiring pattern (wiring layer) including the GND wiring layer 4 on the PI film 21 including the top of the via hole 5. Note that for illustrative convenience, FIG. 3D shows only the GND wiring layer 4. Although not shown, bonding nickel and plating gold are deposited to thicknesses of about 2 to 3 μm and about 0.2 to 0.5 μm on the uppermost PI film, respectively.

As shown in FIG. 3E, the two PI films 21 having the wiring layers are aligned and stacked on the metal plate 1, and simultaneously compression-bonded by a hot press. Simultaneous compression bonding by the hot press adheres the wiring layers and PI films, and adheres the PI films to each other. The copper layer filled in the via hole 5 of the PI film, and the copper layer forming the underlying board or GND wiring layer contact and are connected by the hot press.

Figure 4A:
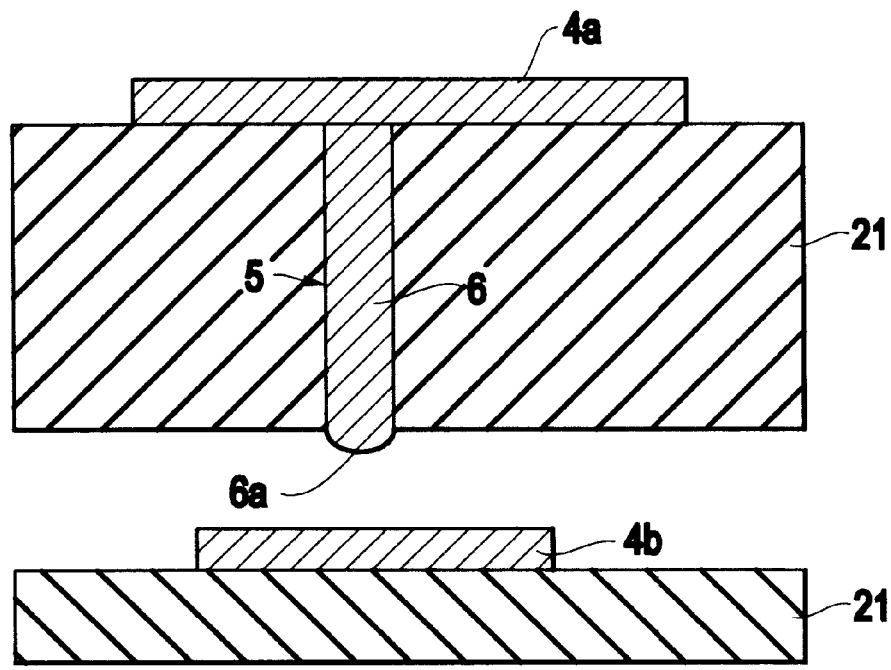
Figure 4B:
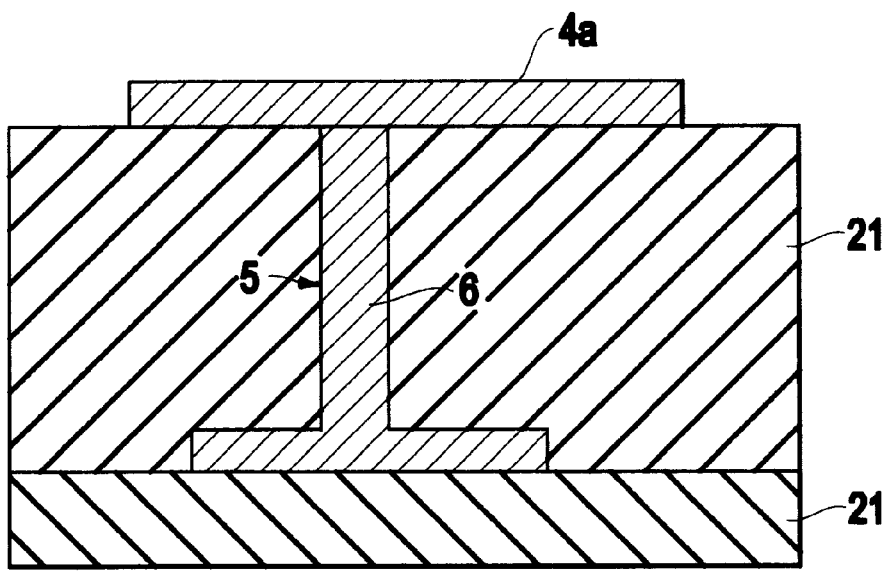

FIGS. 4A and 4B show the contact connection state between the metal layer 6 filled in the via hole 5 and GND wiring layers 4a and 4b. FIG. 4A shows the state before compression bonding, and FIG. 4B shows the state after compression bonding. As shown in FIG. 4A, the lower portion of the metal layer 6 filled in the via hole 5 formed in the PI film 21 before compression bonding projects outward from the via hole 5. In FIGS. 4A and 4B, reference numeral 6a denotes a projection outward from the via hole 5. While the projection 6a faces the underlying GND wiring layer 4b, the simultaneous compression bonding step shown in FIG. 3E is done to crush the projection 6a of the metal layer 6 after compression bonding, and reliably bring the metal layer 6 and the underlying GND wiring layer 4b into contact and connect them, as shown in FIG. 4B.

Figure 5A:
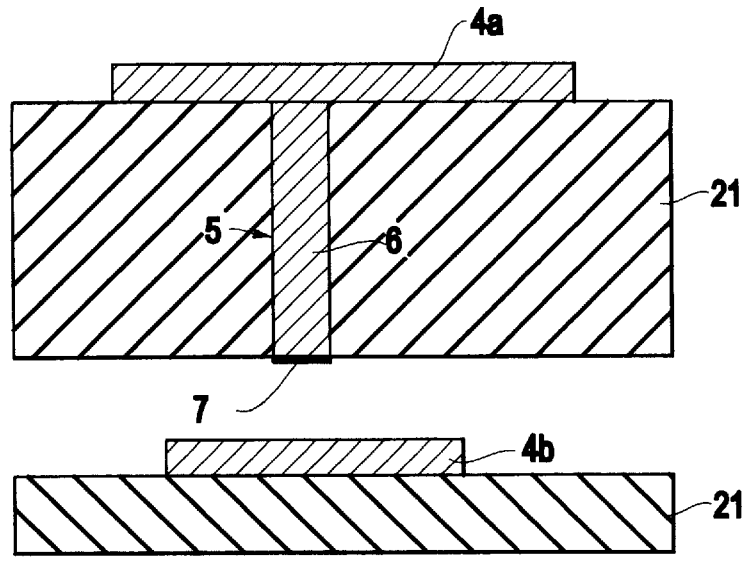
Figure 5B:
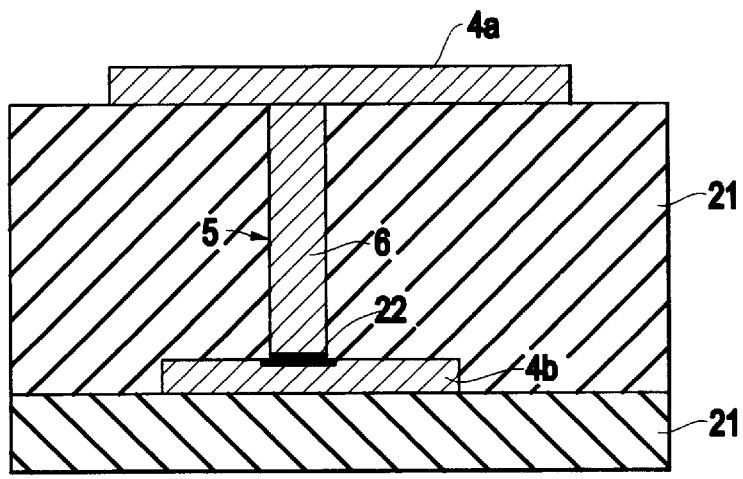

FIGS. 5A and 5B show another example of the connection method in the method of manufacturing the multilayered circuit board for a semiconductor chip module according to the present invention. The metal layer filled in the via hole is alloyed with the GND wiring layer and connected to it. FIG. 5A shows connection by alloying before compression bonding, and FIG. 5B shows connection by alloying after compression bonding. As shown in FIG. 5A, after the via hole 5 is filled with copper to form the metal layer 6, a gold layer 7 is electroplated to a thickness of about 0.05 to 0.5 μm on the lower end of the metal layer 6 formed by filling copper. While the gold layer 7 is formed on the lower end of the metal layer 6, the PI films 21 are compression-bonded by the hot press, as shown in FIG. 5B. Then, gold diffuses into the GND wiring layer 4b on one PI film 21 and the metal layer 6 in the via hole 5 to form a copper-gold alloy 22 at the interface between the GND wiring layer 4 and metal layer 6. This alloy connects the GND wiring layer 4 and metal layer 6.

In general, alloying requires heating. However, as for the gold-copper alloy, gold diffuses into copper around a polyimide adhering temperature (330 to 390° C.) to form an alloy. The present invention uses polyimide for the organic resin sheet, and thus can realize connection using the gold-copper alloy. Instead of gold, a gold-tin alloy thin film may be formed between the wiring layer and filled copper layer. Also in this case, the upper and lower wiring layers 4a and 4b can be electrically connected by the metal layer 6 of the via hole 5 by connection by alloying between the wiring layer and filled copper layer, as shown in FIG. 5B.

A multilayered circuit board for a semiconductor chip module according to another embodiment of the present invention will be described.

Figure 6:
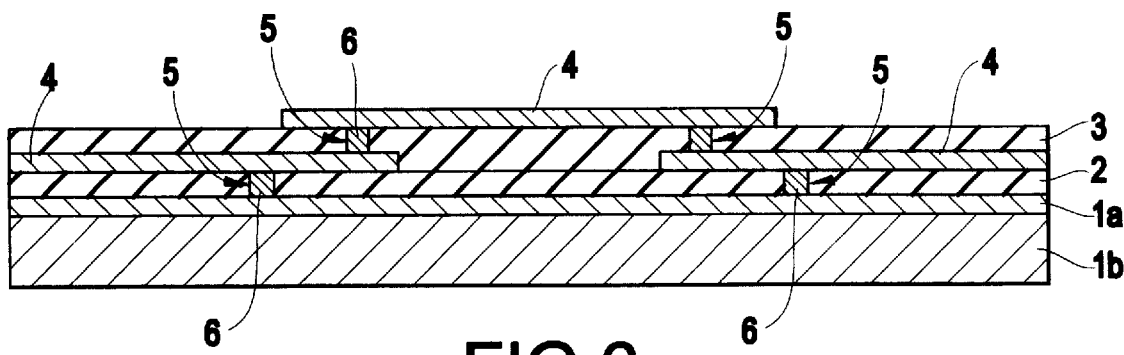
FIG. 6 is a sectional view showing the structure of a multilayered circuit board for a semiconductor chip module according to another embodiment of the present invention.

FIG. 6 shows a multilayered circuit board for a semiconductor chip module according to another embodiment of the present invention. The multilayered circuit board in FIG. 6 is formed from a ceramic plate having a metal film, as an underlying board. In the structure using the ceramic plate, a ceramic plate 1b having a metal film 1a replaces the metal plate 1 in the structure of FIG. 1. The remaining structure is the same as in FIG. 1. The same reference numerals as in FIG. 1 denote the same parts, and a repetitive description thereof will be omitted. This embodiment can also adopt contact connection and connection by alloying as the connection method, similar to the above-described embodiment. When the ceramic plate having the metal film is used as an underlying board, the heat dissipation effect becomes inferior to that of the metal plate serving as an underlying board, as described above. However, when a plurality of MCMs are formed on one underlying board, and cut off one by one, the ceramic plate allows precisely cutting off the MCMs without forming any flash at the cut end face of the underlying board.

The metal plate 1 or metal film 1a is connected to GND in each of the above-described embodiments of the present invention, but can also be connected to a fixed potential such as a power supply potential.

As has been described above, the present invention provides a multilayered circuit board for a semiconductor chip module, comprising an underlying board having a major surface made of a metal material to which a fixed potential is applied, insulating layers which are stacked on the major surface of the underlying board and have wiring layers formed on their surfaces, fixed-potential wiring layers constituting part of the wiring layers formed on the insulating layers, via holes formed below the fixed-potential wiring layers to extend through the insulating layers, and metal layers filled in the via holes so as to make upper ends be connected to the lower surfaces of the fixed-potential wiring layers, wherein one of the insulating layers in contact with the major surface of the underlying board is formed on the underlying board while the lower end of the metal layer is in contact with the major surface of the underlying board, and the other insulating layer formed on the insulating layer in contact with the major surface of the underlying board is stacked while the lower end of the metal layer is in contact with the upper surface of the fixed-potential wiring layer of one insulating layer.

According to the present invention, the wiring layers formed on the insulating layers are connected to the fixed potential through the fixed-potential wiring layers formed on the insulating layers, and the metal layers filled in the via holes in contact with the wiring layers. The fixed-potential wiring layers can be shortened to supply a fixed potential almost equal to a correct fixed potential to a semiconductor chip.

When the underlying board is formed from a metal plate, this metal plate functions as a heat sink to improve the heat dissipation effect.

Even when the underlying board is formed from a metal plate or a ceramic plate using a metal film, a flat metal layer at the fixed potential exists with an electromagnetic shield effect of shielding the board from electromagnetic radiation from below it.

What is claimed is:

1. A multilayer circuit board for a semiconductor chip module, comprising:
    an underlying board having a major surface made of a metal material to which a fixed potential is applied;
    insulating layers which are stacked on the major surface of said underlying board and having wiring layers formed on surfaces of said insulating layers;
    fixed-potential wiring layers forming part of the wiring layers formed on said insulating layers;
    via holes formed below said fixed-potential wiring layers to extend through said insulating layers; and
    metal layers filled in the via holes so as to make upper ends of said metal layers be connected to lower surfaces of said fixed-potential wiring layers,
    wherein a first of said insulating layers is in contact with the major surface of said underlying board having a first metal layer formed therein, and a lower end of the first of said metal layers is in contact with the major surface of said underlying board, and
    wherein a second insulating layer is formed on said first insulating layer and a lower end of a second metal layer is in contact with an upper surface of said fixed-potential wiring layer of said first insulating layer, and
    wherein a gold layer is situated between said second metal layer and said surface of said underlying board.

2. A board according to claim 1, wherein said insulating layers are organic resin sheets made of an organic resin.

3. A board according to claim 2, wherein said organic resin sheets are made of polyimide.

4. A board according to claim 1, wherein the metal material, the wiring layers, and said metal layers filled in the via holes are made of copper.

5. A board according to claim 4, wherein gold is applied to lower ends of said copper metal layers filled in the via holes.

6. A board according to claim 1, wherein said underlying board is a metal plate formed from a lead frame.

7. A board according to claim 6, wherein the metal plate is formed from copper.

8. A board according to claim 1, wherein said underlying board is formed from a ceramic plate having a metal film on the major surface.

9. The multilayered circuit board according to claim 1, further comprising:
    a plurality of chips mounted on an upper surface of said wiring layers.

10. The multilayered circuit board according to claim 1, wherein said wiring layers are directly connected to said underlying board through said via holes.

11. The multilayer circuit board for a semiconductor chip module according to claim 1, further comprising a second gold layer situated between said first metal layer and said surface of said underlying board.

12. The multilayer circuit board for a semiconductor chip module according to claim 1, further comprising a second gold layer situated between said second metal layer and the upper surface of said fixed potential wiring layer of said first insulating layer.

13. A multilayer circuit board for a semiconductor chip module comprising:

an underlying board having a surface made of a metal material to which a fixed potential is applied;

insulating layers which are stacked on the surface of said underlying board and having wiring layers formed on surfaces of said insulating layers;

fixed-potential wiring layers forming part of the wiring layers formed on said insulating layers;

via holes formed below said fixed-potential wiring layers to extend through said insulating layers;

metal layers filled in the via holes so as to make upper ends be connected to lower surfaces of said fixed-potential wiring layers;

a first insulating layer in contact with the surface of said underlying board, said first insulating layer having a first metal layer formed therein, wherein a lower end of the first of said metal layers is in contact with the surface of said underlying board; and a second insulating layer formed on said first insulating layer, said second insulating layer having a second metal layer formed therein, wherein a lower end of the second metal layer is in contact with an upper surface of said fixed-potential wiring layer of said first insulating layer, wherein a first gold layer is situated between said first metal layer and said surface of said underlying board.

14. A multilayer circuit board for a semiconductor chip module, comprising:

an underlying board having a surface made of a metal material to which a fixed potential is applied;

insulating layers which are stacked on the surface of said underlying board and having wiring layers formed on surfaces of said insulating layers;

fixed-potential wiring layers forming part of the wiring layers formed on said insulating layers;

via holes formed below said fixed-potential wiring layers to extend through said insulating layers;

metal layers filled in the via holes so as to connect upper ends of said metal layers to lower surfaces of said fixed-potential wiring layers;

a first insulating layer in contact with the surface of said underlying board, said first insulating layer having a first metal layer formed therein, wherein a lower end of the first of said metal layers is in contact with the surface of said underlying board;

a first gold layer situated between the first metal layer and the surface of the underlying board;

a second insulating layer formed on said first insulating layer, said second insulating layer having a second metal layer formed therein, wherein a lower end of the second metal layer is in contact with an upper surface of said fixed-potential wiring layer of said first insulating layer; and a second gold layer situated between the second metal layer and the upper surface of said fixed potential wiring layer of said first insulating layer.

15. A multilayer circuit board for a semiconductor chip module, comprising an underlying board having a surface made of a metal material to which a fixed potential is applied;

insulating layers which are stacked on the surface of said underlying board and having wiring layers formed on surfaces of said insulating layers;

fixed-potential wiring layers forming part of the wiring layers formed on said insulating layers;

via holes formed below said fixed-potential wiring layers to extend through said insulating layers;

metal layers filled in the via holes so as to connect upper ends of said metal layers to lower surfaces of said fixed-potential wiring layers;

a first gold layer situated between a first metal layer and the major surface of the underlying board; and a second gold layer situated between a second metal layer and the upper surface of said fixed potential wiring layer of said first insulating layer, wherein a first insulating layer is in contact with the major surface of the underlying board and a lower end of the first metal layer is in contact with the major surface of said underlying board, and a second insulating layer is formed on said first insulating layer and a lower end of the second metal layer is in contact with an upper surface of said fixed-potential wiring layer of said first insulating layer.

* * * * *